US012684810B2

(12) United States Patent
Peake

(10) Patent No.: US 12,684,810 B2
(45) Date of Patent: Jul. 14, 2026

(54) METAL OXIDE SEMICONDUCTOR FIELD EFFECT TRANSISTOR AND METHOD OF MANUFACTURING

(71) Applicant: NEXPERIA B.V., Nijmegen (NL)

(72) Inventor: Steven Peake, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 788 days.

(21) Appl. No.: 18/152,881

(22) Filed: Jan. 11, 2023

(65) Prior Publication Data

US 2023/0246104 A1     Aug. 3, 2023

(30) Foreign Application Priority Data

Jan. 11, 2022    (EP) ..................................... 22151030

(51) Int. Cl.
*H10D 30/66*     (2025.01)
*H10D 30/01*     (2025.01)
*H10D 62/10*     (2025.01)
*H10D 64/27*     (2025.01)

(52) U.S. Cl.
CPC ....... *H10D 30/668* (2025.01); *H10D 30/0297* (2025.01); *H10D 62/127* (2025.01); *H10D 64/513* (2025.01); *H10D 64/516* (2025.01)

(58) Field of Classification Search
CPC ............. H10D 30/668; H10D 30/0297; H10D 64/513; H10D 64/516; H10D 62/127
USPC ....................................................... 257/330
See application file for complete search history.

(56) References Cited

U.S. PATENT DOCUMENTS

| | | | |
|---|---|---|---|
| 2009/0140327 A1* | 6/2009 | Hirao ................... | H10D 64/117 |
| | | | 438/270 |
| 2012/0241854 A1 | 9/2012 | Ohta et al. | |
| 2015/0084121 A1* | 3/2015 | Siemieniec .......... | H10D 64/252 |
| | | | 438/270 |
| 2016/0336443 A1 | 11/2016 | Sumida et al. | |
| 2017/0236934 A1* | 8/2017 | Rankila .............. | H10D 64/2527 |
| | | | 438/468 |

OTHER PUBLICATIONS

Extended European Search Report for corresponding European application EP22151030.8, 10 pages dated Jul. 5, 2022.

* cited by examiner

*Primary Examiner* — Igwe U Anya
(74) *Attorney, Agent, or Firm* — Ruggiero McAllister & McMahon LLC

(57)          ABSTRACT

A Metal Oxide Semiconductor (MOS), Field Effect Transistor (FET), (MOSFET) is provided, including a semiconductor body having a first major surface, and two trenches extending in the semiconductor body from the first major surface, a source region of a first conductivity type adjacent sidewalls of the two trenches at the first major surface, a drain region of the first conductivity type adjacent the two trenches at a position distant from the source region, a channel-accommodating region, of a second conductivity type opposite to the first conductivity type, adjacent the sidewalls of the two trenches between the source region and the drain region, and a first of the two trenches extends further into the semiconductor body compared to a second of the two trenches.

19 Claims, 5 Drawing Sheets

Super-junction
restricts current flow
in-between trenches

METAL OXIDE SEMICONDUCTOR FIELD EFFECT TRANSISTOR AND METHOD OF MANUFACTURING

CROSS-REFERENCE TO RELATED APPLICATIONS

This application claims the benefit under 35 U.S.C. § 119(a) of European Application No. 22151030.8 filed Jan. 11, 2022, the contents of which are incorporated by reference herein in their entirety.

BACKGROUND

1. Field of the Disclosure

The present disclosure generally relates to the field of semiconductor electronics and more specifically to a Metal Oxide Semiconductor Field Effect Transistor, MOSFET, with two trenches.

2. Description of the Related Art

Metal Oxide Semiconductor, MOS, Field Effect Transistors, MOSFETs are known in the art. Compared to other semiconductor devices, such as an insulated gate bipolar transistor, IGBT, or a thyristor, the main advantages of the MOSFET devices are higher switching speed and good efficiency at low voltages. It shares with the IGBT an isolated gate that makes it easy to drive. A MOSFET can be subject to low gain, sometimes to a degree that the gate voltage needs to be higher than the voltage under control.

The design of MOSFETs was made possible by the evolution of MOSFETs and complementary metal-oxide-semiconductor, CMOS, technology, which is used for manufacturing integrated circuits. The MOSFET has similar operating principles as its low-power counterpart, i.e. a lateral MOSFET.

Vertical reduced surface field, RESURF, devices are also known in the art. The low on-resistance and the high breakdown voltage, BV, in lateral RESURF devices make them desirable for use in high voltage integrated circuit, HVIC, technologies. Although desirable, RESURF devices suffer from the unique requirement of accurate charge control and they are very sensitive to charge balance. Variations on charge control may lead to a lower BV causing limitations on the device performance. This requirement complicates the manufacturability of RESURF devices. It is rather difficult to obtain a BV that is reproducible in fabrication.

A known device based on super junction technologies is shown in FIG. 1. It can achieve RESURF by depleting an n-type epi 12 between two deep p-type super junction pillars 10. The extent/depth of the super junction pillars determine the breakdown voltage of the device. Such a device also comprises a gate electrode 14 of n-type polysilicon, a thick oxide 16 grown thermally on the bottom side of the gate electrode 14, and thick oxide dielectric layer 18 on the upper side of the gate electrode 14. The thickness of the thick oxide dielectric layer 18 can be in a range between 400 nm to 800 nm. The device further comprises a source metallization 20. Electron flow lines 22 and current flowlines 24 are also shown in FIG. 1.

Such a super junction restricts current flow in the epi region between the deep p-type super junction pillars 10. The presence of the deep super junction p-type pillars 65 creates low drain-source voltage, Vds, depletion regions that extends into the n-type epi and current cannot flow in these regions. For example: for a 1.5 μm cell pitch, less than a third of the total cell is open to current flow.

Further reductions in cell pitch offer little benefit as higher cell density is out-weighed by the further restriction or so-called current pinching in-between the super junction deep p-type regions.

FIG. 2 illustrates a device known in the art. In this case the superjunction pillars are omitted and the RESURF is achieved by utilizing the area under the trench. Such a device comprises a gate electrode 40 made of n-type polysilicon, a deposited oxide region 42 at the bottom side of the gate electrode 40, and an oxide dielectric layer 44 on the upper side of the gate electrode 40. There is a source metallisation 46 around the oxide dielectric layer 44. The device further comprises a n-type arsenic source implant 48, a p-type body region 50 of boron, a n-type epi (1e16 cm-2 to 8e16 cm-2) 52 and n-type substrate 54.

In FIG. 2 a cell pitch of about 1.1 μm is shown, wherein the RESURF is achieved via the oxide deposited and then etched to a pre-defined depth. The join between the in-trench etched oxide and the gate oxide is critical and should be smooth.

Creating such a known device comprises the following steps, as shown in FIG. 3:

step 80: within an n-type epi 120, etch a trench, deposit an oxide and etch back to required depth, wherein a trench region 122 and a thick deposited oxide 124 are created step 82: grow a first sacrificial oxide layer 100 step 84: etch the first sacrificial oxide layer, deposit a first tetraethyl orthosilicate (TEOS) layer of about 100 nm and isotopically etch step 86: grow a second sacrificial oxide layer 102 step 88: etch the second sacrificial oxide layer, deposit a second TEOS layer of about 100 nm and isotopically etch step 90: grow a gate oxide 104

This results in a nice smooth join between the deposited oxide and the gate oxide. The trench width is about 0.60 μm, as for deep oxide trench RESURF the width of the oxide layer (layer 124 in FIG. 3) in the trench determines the breakdown voltage for a given cell pitch. In this way an optimal MESA width (cell pitch-trench width) can be determined for the specified 0.60 μm trench width.

A problem of such RESURF devices, as known in the art, is that it is not possible to achieve a very low drain-source on resistance (Rdson) without using very narrow cell pitch and/or high simple gate charge (Qg) structures.

SUMMARY

A summary of certain aspects of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects and/or a combination of aspects that may not be set forth.

It would be advantageous to achieve a Metal Oxide Semiconductor, MOS, Field Effect Transistor, FET, MOS-FET, that has improved Rdson properties. It would further be advantageous to achieve a corresponding method for manufacturing such a MOSFET.

In a first aspect of the present disclosure, there is provided a Metal Oxide Semiconductor, MOS, Field Effect Transistor, FET, MOSFET, comprising a semiconductor body having a first major surface, and two trenches extending in the semiconductor body from the first major surface, a source region of a first conductivity type adjacent sidewalls of said two trenches at the first major surface;

a drain region of the first conductivity type adjacent the two trenches at a position distant from the source region;

a channel-accommodating region, of a second conductivity type opposite to the first conductivity type, adjacent the sidewalls of the two trenches between the source region and the drain region, wherein a first of said two trenches extends further into said semiconductor body compared to a second of said two trenches.

It is noted that a source contact may be electrically connected to the source region, a drain contact may be electrically connected to the drain region and a gate contact may be electrically connected to the gate region.

The channel-accommodating region may abut the source region on a side opposite to the side of the source region which abuts the trench.

The first trench of the two trenches may be considered as a deep trench and the second trench of the two trenches may be considered as a shallow trench. The deep trench may be construed by a trench within a trench process which is explained in more detail with reference to the figures. The shallow trench may be construed by a known process for creating a trench in a semiconductor material.

It is noted that the MOSFET in accordance with the present disclosure provides for a reduced Rdson. The first trench being the deep trench may be construed by a trench within a trench process wherein a relatively large Thick Bottom Oxide, TBO, may be provided at the bottom side of the trench. This results in a TBO profile that reduces the mesa width in the direction extending into the semiconductor material. This enables the use of a very high grading implant to be used which reduces the Rdson.

Increasing the doping of the epi, i.e. reference numeral 12 in FIG. 1, using an implant species similar to that of the epi. That may be an n-type donor species because the epi may also be n-type. The implant species grades the net n-type charge in the epi from high dose at the surface to low dose at the substrate, i.e. reference numeral 54 in FIG. 2.

The MOSFET in accordance with the present disclosure allows for a first trench to have a shape such that the mesa width reduces underneath the channel accommodating region. This is beneficial as this improved the breakdown volage of the MOSFET.

In an example, the first trench of the two trenches has a non-uniform dielectric thickness.

In prior art solutions, the dielectric that is used in a trench is typically uniform or close to uniform in thickness. That is, the width of the dielectric in the downward direction, i.e. extending from the from the first major surface in the semiconductor material is constant or close to constant.

This particular example describes the situation in which the dielectric is not substantially the same along the downward directed trench. In particular, it may be beneficial if the width of the dielectric, at the same height as the channel accommodating region, is larger compared to the width of the dielectric further extending into the semiconductor material. The ratio between these widths may, for example, be 2:1, 3:1 or 4:1.

The above may, for example, be beneficial for the dynamic properties of the MOSFET.

The first trench may have a uniform dielectric thickness or may have a non-uniform dielectric thickness.

In a further example, the first trench of the two trenches is provided with an oxide layer, wherein a thickness of said oxide layer is non-uniform in a direction in which the first trench extends in the semiconductor body.

The above entails that the first trench may be provided with a relatively thick TBO. The thickness of the TBO may be non-uniform.

In yet another example, the first trench of the two trenches has a drop-shaped cross-section.

The advantage hereof is that the mesa width will first gradually reduce before it starts increasing again. This seen from the direction of penetration of the trench into the semiconductor material. The benefit of a reduced mesa width is that the MOSFET has a higher breakdown voltage.

In a further example, the first of the two trenches extends 2-6 times further into the semiconductor body compared to the second of the two trenches, preferably 3-5 times further.

The first trench may, for example, penetrate or extend about 600 nm-900 nm into the semiconductor material. The second trench may, for example, penetrate or extend about 300 nm-500 nm into the semiconductor material.

In a further example, a profile of the first of the two trenches is such that a smallest mesa width is about 0.3-0.6 times compared to the largest mesa width.

In a further example, a doping profile of said drain region is monotonically decreasing from a point B in a direction away from the channel accommodating region, wherein at point B the mesa width is the smallest.

In another example, both the first and the second of the two trenches are connected to a gate terminal of the MOSFET. This gives the lowest specific Rdson properties.

In a further example, the first of the two trenches is connected to a source terminal of the MOSFET and the second of the two trenches is connected to a gate terminal of the MOSFET. This gives good Rdson properties and good dynamic properties of the MOSFET.

It is further noted that, in case the first trench is connected to the source terminal, the upper oxide thickness may be very thin in order to give the best MCD performance of the MOSFET.

In yet another example, the channel-accommodating region is isolated from the sidewalls of the two trenches by oxide layers, respectively.

In another example, a thickness of the oxide layers, at the channel-accommodating region, is in a range from 50 nm to 700 nm.

In the channel region: If it is a gate electrode then the oxide separating gate from body region, i.e. reference numeral 50 in FIG. 2, may be in the range 50 nm to 70 nm, preferably above 100 nm. If it is a source electrode, i.e. an MCD configuration, as in the shallow trench claim, then that oxide may be in the region of 5 nm to 25 nm. MCD performance is better the thinner the oxide layer.

In a second aspect of the present disclosure, there is provided a method of manufacturing a Metal Oxide Semiconductor, MOS, Field Effect Transistor, MOSFET, in accordance with any of the previous claims, wherein said method comprises the steps of:

providing a semiconductor substrate;

creating the first and second trench in said semiconductor substrate.

It is noted that the advantages as explained with reference to the first aspect of the present disclosure, being the MOSFET, are also applicable to the second aspect of the present disclosure, being the method to manufacture such a MOSFET.

In an example, the method comprises the steps of:

creating the first trench in the semiconductor substrate and, when completed, creating the second trench in the semiconductor substrate.

The above and other aspects of the disclosure will be apparent from and elucidated with reference to the examples described hereinafter.

DETAILED DESCRIPTION

The present disclosure is described in conjunction with the appended figures. It is emphasized that, in accordance with the standard practice in the industry, various features are not drawn to scale. In fact, the dimensions of the various features may be arbitrarily increased or reduced for clarity of discussion.

Figure 1:
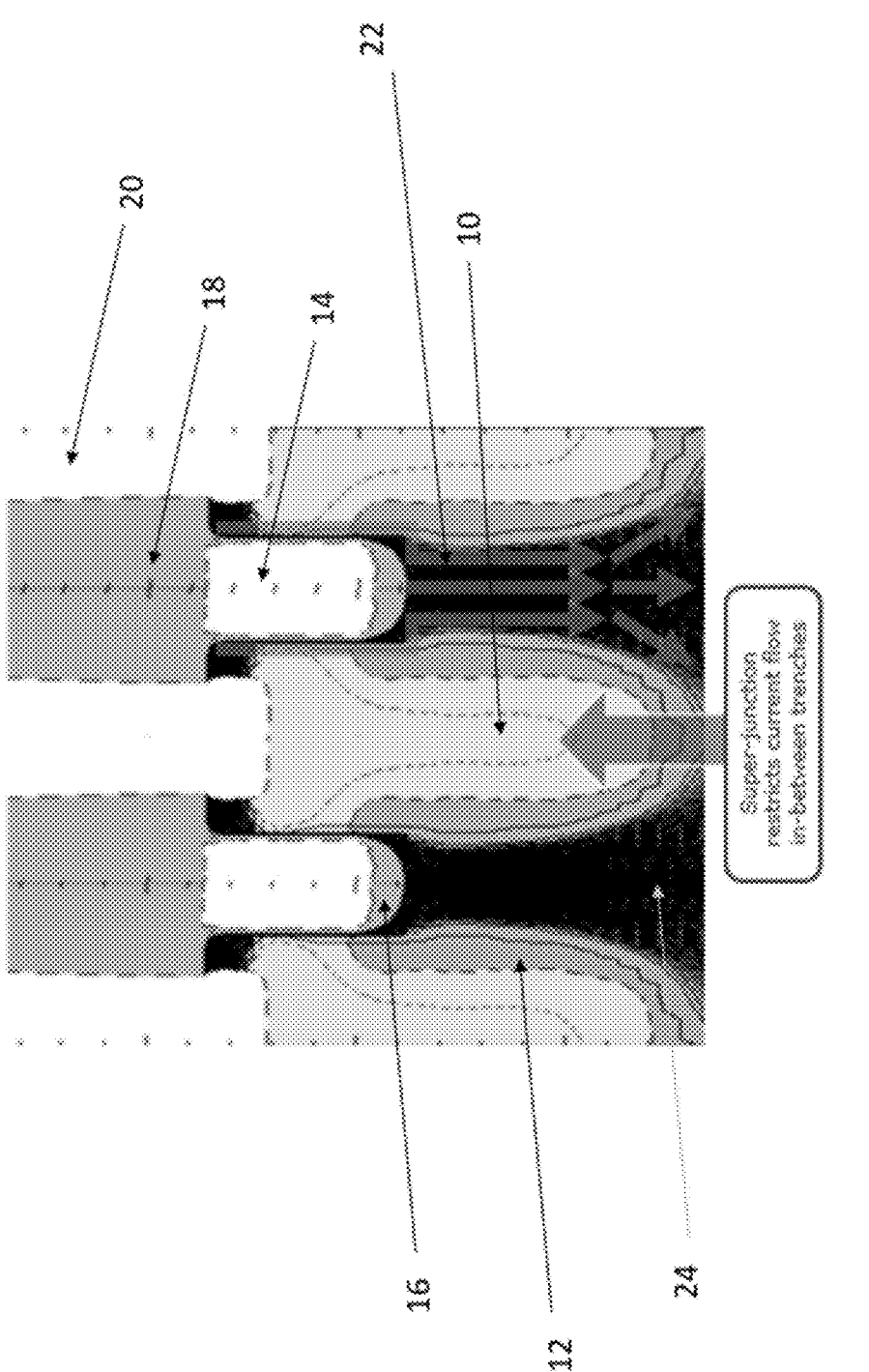
FIG. 1 shows a known semiconductor device.
Figure 2:
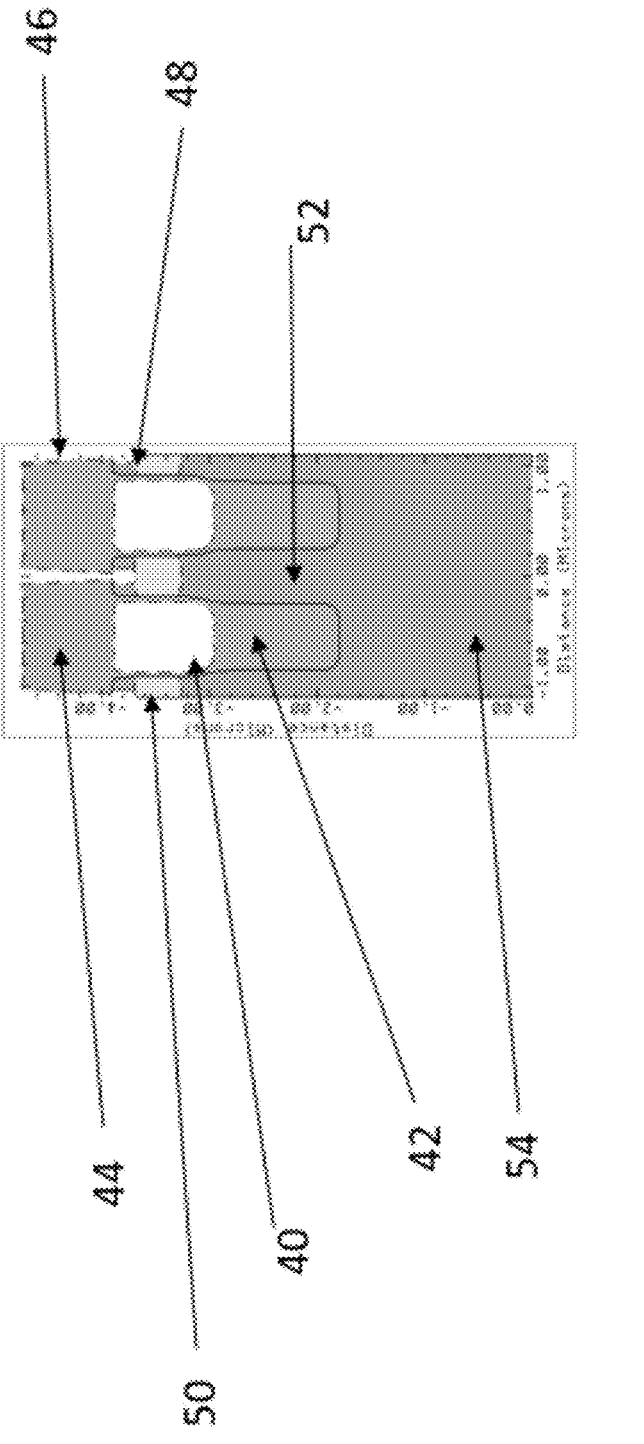
FIG. 2 shows a known semiconductor device.
Figure 3:
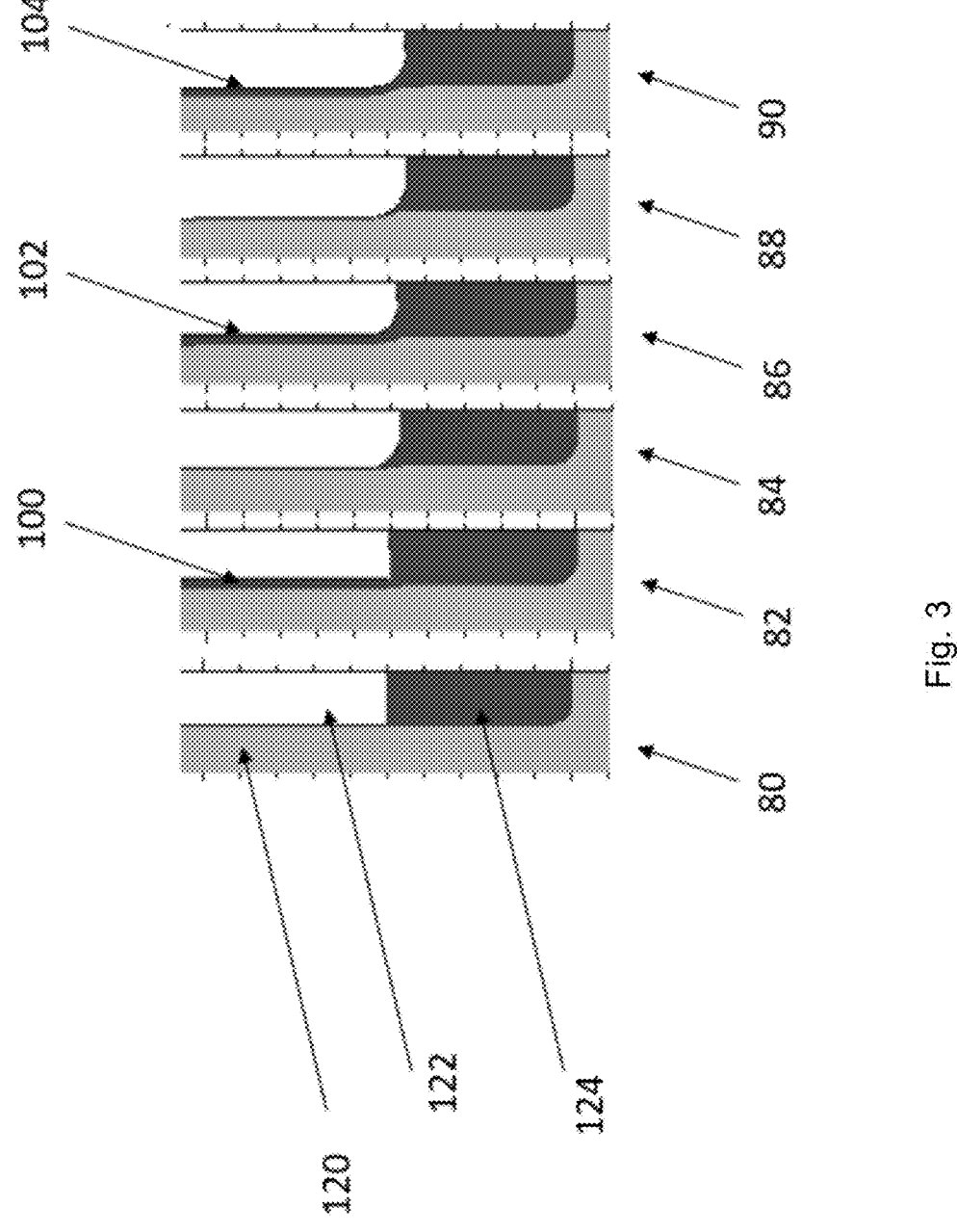
FIG. 3 shows method steps for creating a known semiconductor device.

FIGS. 1-3 have been elaborated in the background section of the present disclosure.

Figures 4, 5:
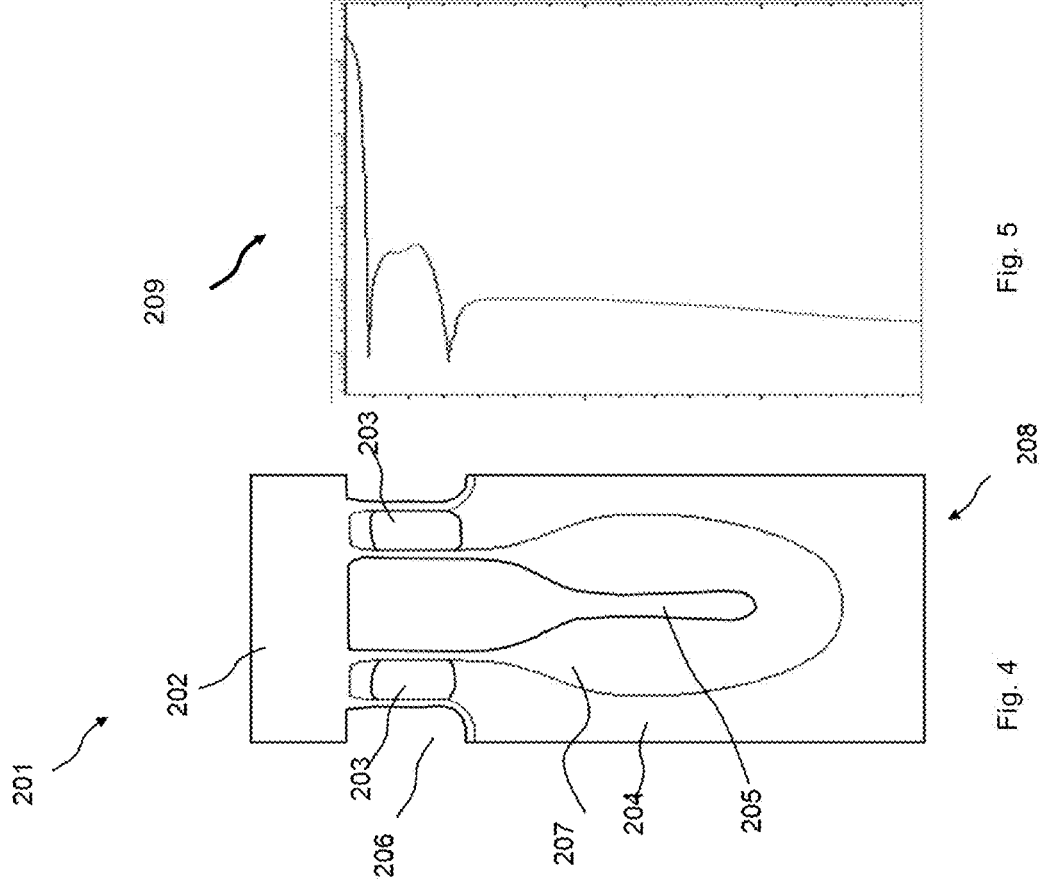
FIG. 4 shows a Metal Oxide Semiconductor, MOS, Field Effect Transistor, MOSFET, in accordance with the present disclosure.
FIG. 5 shows a doping profile related to the MOSFET shown in FIG. 4.

FIG. 4 shows a Metal Oxide Semiconductor, MOS, Field Effect Transistor, MOSFET, 201 in accordance with the present disclosure.

A Metal Oxide Semiconductor, MOS, Field Effect Transistor, FET, MOSFET, 201 comprising a semiconductor body having a first major surface, and two trenches 205, 206 extending in the semiconductor body from the first major surface, a source region, i.e. on top of reference numeral 202, of a first conductivity type adjacent sidewalls of said two trenches at the first major surface;

a drain region 208 of the first conductivity type adjacent the two trenches at a position distant from the source region;

a channel-accommodating region 203, of a second conductivity type opposite to the first conductivity type, adjacent the sidewalls of the two trenches between the source region and the drain region, wherein a first 205 of said two trenches 206 extends further into said semiconductor body compared to a second of said two trenches.

The EPI layer is indicated with reference numeral 204. A shown, the first trench 205 comprises an oxide layer as indicated with reference numeral 207. The first trench 205 is formed such that it has a drop-shaped, for example teardrop-shaped, cross section. This means that the "belly" of the trench extend to underneath the channel-accommodating region 203. This improved the breakdown voltage of the MOSFET 201.

It is further shown that the thickness of the oxide 207 is not uniform along the vertical direction. The result is that the amount of material present in the electrode 205 is reduced, thereby improving dynamic properties of the MOSFET 201.

FIG. 5 shows a doping profile 209 related to the MOSFET 201 shown in FIG. 4.

The doping profile increases over the channel-accommodating region. The doping profile is then about constant in the vertical direction, until a point wherein the mesa width is sufficiently low. From thereon, the doping profile is decreasing slowly, thereby improving the breakdown voltage.

Figure 6:
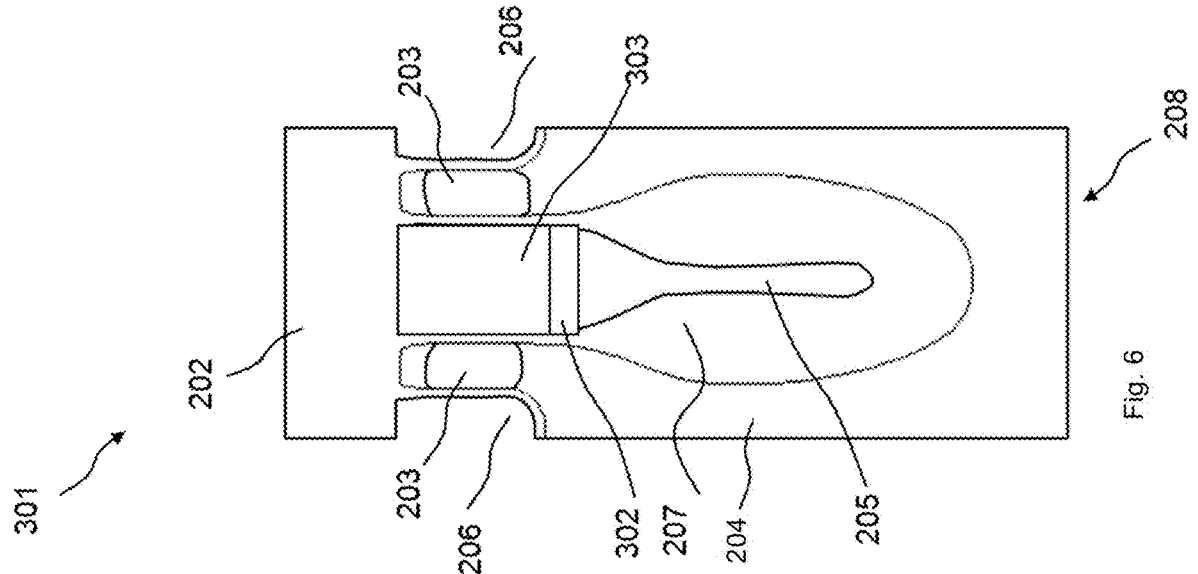
FIG. 6 shows a MOSFET in accordance with the present disclosure.

FIG. 6 shows a MOSFET 301 in accordance with the present disclosure.

Different to the MOSFET shown in FIG. 4 is that the first trench 205 MOSFET 301, is divided into two parts (303 and 205) and isolated with a further oxide 302. The advantage hereof is that a first part of the trench may be connected to the source of the MOSFET and the second part of the trench may be connected to the gate of the MOSFET. That is, reference numeral 303 may be connected to gate and reference numeral 205 may be connected to source.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

The ensuing description above provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment of the disclosure, it being understood that various changes may be made in the function and arrangement of elements, including combinations of features from different embodiments, without departing from the scope of the disclosure.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, electromagnetic, or a combination thereof. Additionally, the words "herein," "above," "below," and words of similar import, when used in this application, refer to this application as a whole and not to any particular portions of this application. Where the context permits, words in the Detailed Description using the singular or plural number may also include the plural or singular number respectively. The word "or," in reference to a list of two or more items, covers all of the following interpretations of the word: any of the items in the list, all of the items in the list, and any combination of the items in the list.

The teachings of the technology provided herein can be applied to other systems, not necessarily the system described below. The elements and acts of the various examples described below can be combined to provide further implementations of the technology. Some alternative implementations of the technology may include not only additional elements to those implementations noted below, but also may include fewer elements.

These and other changes can be made to the technology in light of the following detailed description. While the description describes certain examples of the technology, and describes the best mode contemplated, no matter how detailed the description appears, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while some aspect of the technology may be recited as a computer-readable medium claim, other aspects may likewise be embodied as a computer-readable medium claim, or in other forms, such as being embodied in a means-plus-function claim.

In the description above, for the purposes of explanation, numerous specific details are set forth in order to provide a thorough understanding of implementations of the disclosed technology. It will be apparent, however, to one skilled in the art that embodiments of the disclosed technology may be practiced without some of these specific details.

The techniques introduced herein can be embodied as special-purpose hardware (e.g., circuitry), as programmable circuitry appropriately programmed with software and/or firmware, or as a combination of special-purpose and pro-grammable circuitry. Hence, embodiments may include a machine-readable medium having stored thereon instructions which may be used to program a computer (or other electronic devices) to perform a process. The machine-readable medium may include, but is not limited to, floppy diskettes, optical disks, compact disc read-only memories (CD-ROMs), magneto-optical disks, ROMs, random access memories (RAMs), erasable programmable read-only memories (EPROMs), electrically erasable programmable read-only memories (EEPROMs), magnetic or optical cards, flash memory, or other type of media/machine-readable medium suitable for storing electronic instructions. The machine-readable medium includes non-transitory medium, where non-transitory excludes propagation signals. For example, a processor can be connected to a non-transitory computer-readable medium that stores instructions for executing instructions by the processor.

What is claimed is:

1. A Metal Oxide Semiconductor Field Effect Transistor (MOSFET), comprising:
a semiconductor body having a first major surface, and two trenches extending in the semiconductor body from the first major surface;
a source region of a first conductivity type adjacent to sidewalls of the two trenches at the first major surface;
a drain region of the first conductivity type adjacent to the two trenches at a position distant from the source region;
a channel-accommodating region of a second conductivity type opposite to the first conductivity type, adjacent to the sidewalls of the two trenches between the source region and the drain region;
wherein of the two trenches, a first trench extends further into the semiconductor body compared to a second trench of the two trenches, and
wherein the drain region has a doping profile that is monotonically decreasing from a point B in a direction away from the channel-accommodating region, and wherein at point B a mesa width is the smallest.

2. The MOSFET in accordance with claim 1, wherein the first trench of the two trenches has a non-uniform dielectric thickness.

3. The MOSFET in accordance with claim 2, wherein:
the first trench of the two trenches is provided with an oxide layer,
and wherein the oxide layer has a thickness that is non-uniform in a direction in which the first trench extends in the semiconductor body.

4. The MOSFET in accordance with claim 2, wherein the first trench of the two trenches has a drop-shaped cross-section.

5. The MOSFET in accordance with claim 2, wherein the first of the two trenches extends 3 to 5 times further into the semiconductor body compared to the second of the two trenches.

6. The MOSFET in accordance with previous claim 2, wherein the first of the two trenches has a profile so that a smallest mesa width is about 0.3-0.6 times a largest mesa width.

7. The MOSFET in accordance with claim 1, wherein the first trench of the two trenches is provided with an oxide layer, and wherein the oxide layer has a thickness that is non-uniform in a direction in which the first trench extends in the semiconductor body.

8. The MOSFET in accordance with claim 1, wherein the first trench of the two trenches has a drop-shaped cross-section.

9. The MOSFET in accordance with claim 1, wherein the first of the two trenches extends 2 to 6 times further into the semiconductor body compared to the second of the two trenches.

10. The MOSFET in accordance with claim 1, wherein the first of the two trenches has a profile so that a smallest mesa width is about 0.3 to 0.6 times a largest mesa width.

11. The MOSFET in accordance with claim 1, wherein the first of the two trenches is connected to a source terminal of the MOSFET, and wherein the second of the two trenches is connected to a gate terminal of the MOSFET.

12. The MOSFET in accordance with claim 1, wherein the channel-accommodating region is isolated from the side-walls of the two trenches by oxide layers, respectively.

13. The MOSFET in accordance with claim 12, wherein the oxide layers have a thickness at the channel-accommodating region, that is in a range from 32 nm to 70 nm.

14. The MOSFET in accordance with claim 12, wherein the oxide layers have a thickness at the channel-accommodating region, that is in a range from 5 nm to 25 nm.

15. The MOSFET in accordance with claim 1, wherein:
the first of the two trenches has a profile so that a smallest mesa width is about 0.3 to 0.6 times a largest mesa width;
wherein the drain region has a doping profile that is monotonically decreasing from a point B in a direction away from the channel-accommodating region, and wherein at point B a mesa width is the smallest; and
wherein the first trench of the two trenches has a drop-shaped cross-section.

16. A method of manufacturing a Metal Oxide Semiconductor Field Effect Transistor (MOSFET), in accordance with claim 1, wherein the method comprises the steps of:

providing a semiconductor substrate; and creating the first and second trench in the semiconductor substrate.

17. The method of manufacturing a MOSFET in accordance with claim 16, wherein the method comprises the steps of:

creating the first trench in the semiconductor substrate and, when completed, creating the second trench in the semiconductor substrate.

18. A Metal Oxide Semiconductor Field Effect Transistor (MOSFET), comprising:

a semiconductor body having a first major surface, and two trenches extending in the semiconductor body from the first major surface;

a source region of a first conductivity type adjacent to sidewalls of the two trenches at the first major surface;

a drain region of the first conductivity type adjacent to the two trenches at a position distant from the source region;

a channel-accommodating region of a second conductivity type opposite to the first conductivity type, adjacent to the sidewalls of the two trenches between the source region and the drain region; and wherein of the two trenches, a first trench extends further into the semiconductor body compared to a second trench of the two trenches, and, wherein both the first and the second of the two trenches are connected to a gate terminal of the MOSFET.

19. A Metal Oxide Semiconductor Field Effect Transistor (MOSFET), comprising:

a semiconductor body having a first major surface, and two trenches extending in the semiconductor body from the first major surface;

a source region of a first conductivity type adjacent to sidewalls of the two trenches at the first major surface;

a drain region of the first conductivity type adjacent to the two trenches at a position distant from the source region;

a channel-accommodating region, of a second conductivity type opposite to the first conductivity type, adjacent to the sidewalls of the two trenches between the source region and the drain region; and wherein of the two trenches, a first trench extends further into the semiconductor body compared to a second trench of the two trenches;

wherein the first of the two trenches has a profile so that a smallest mesa width is about 0.3 to 0.6 times a largest mesa width;

wherein the drain region has a doping profile that is monotonically decreasing from a point B in a direction away from the channel-accommodating region, and wherein at point B a mesa width is the smallest; and wherein the first trench of the two trenches has a drop-shaped cross-section.

* * * * *